United States Patent
Lin et al.

(10) Patent No.: US 10,459,590 B2
(45) Date of Patent: Oct. 29, 2019

(54) TOUCH PANEL AND MANUFACTURING METHOD THEREOF

(71) Applicant: TPK Touch Solutions (Xiamen) Inc., Xiamen (CN)

(72) Inventors: Ching-Shan Lin, Tainan (TW); Chunyan Wu, Sanming (CN); Lianjie Ji, Xiamen (CN); Fang Fang, Xiamen (CN)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 756 days.

(21) Appl. No.: 14/637,377

(22) Filed: Mar. 3, 2015

(65) Prior Publication Data

US 2015/0177889 A1    Jun. 25, 2015

Related U.S. Application Data

(63) Continuation of application No. 14/467,992, filed on Aug. 25, 2014, now Pat. No. 9,164,644.

(30) Foreign Application Priority Data

Sep. 29, 2013  (CN) .......................... 2013 1 0454870
Jun. 4, 2014   (CN) .......................... 2014 1 0244190

(51) Int. Cl.
*G06F 3/044*     (2006.01)
*G06F 3/047*     (2006.01)
(Continued)

(52) U.S. Cl.
CPC .............. *G06F 3/047* (2013.01); *B32B 33/00* (2013.01); *B32B 37/025* (2013.01); *B32B 37/24* (2013.01);
(Continued)

(58) Field of Classification Search
CPC ...................................................... B32B 27/32
See application file for complete search history.

(56) References Cited

U.S. PATENT DOCUMENTS 5,897,727 A    4/1999  Staral et al.
8,609,514 B2  12/2013  Moriceau et al.
(Continued)

FOREIGN PATENT DOCUMENTS

CN    101424992    5/2009
CN    101676845    3/2010
(Continued)

OTHER PUBLICATIONS

Abstract of Katsumi, JP54050898.*

*Primary Examiner* — Ian A Rummel
(74) *Attorney, Agent, or Firm* — Cooper Legal Group, LLC

(57) ABSTRACT

A touch panel is formed by firstly forming a film layer on a first plate, and next, sequentially forming a buffer layer on the film layer, forming a sensing layer on the buffer layer, forming a second plate on the sensing layer. After the foregoing formation procedures, the first plate is removed from the film layer. Next, a cover is attached to the film layer. In this way, the film layer is located between the cover and the buffer layer. Finally, the second plate is removed from the sensing layer, so as to form a touch panel with the features of light weight, thin thickness and low costs.

28 Claims, 9 Drawing Sheets

(51) Int. Cl.

| | | |
|---|---|---|
| *B32B 37/00* | (2006.01) | |
| *B32B 37/24* | (2006.01) | |
| *B32B 38/00* | (2006.01) | |
| *B32B 43/00* | (2006.01) | |
| *G06F 1/16* | (2006.01) | |
| *H03K 17/96* | (2006.01) | |
| *B32B 33/00* | (2006.01) | |
| *G06F 3/041* | (2006.01) | |
| *G02F 1/1333* | (2006.01) | |

(52) U.S. Cl.
CPC ...... *B32B 38/0004* (2013.01); *B32B 38/0008* (2013.01); *B32B 38/0036* (2013.01); *B32B 43/006* (2013.01); *G06F 1/1692* (2013.01); *G06F 3/041* (2013.01); *G06F 3/044* (2013.01); *H03K 17/9618* (2013.01); *B32B 2037/243* (2013.01); *B32B 2038/0076* (2013.01); *B32B 2305/38* (2013.01); *B32B 2307/202* (2013.01); *B32B 2310/0831* (2013.01); *B32B 2457/208* (2013.01); *G02F 1/13338* (2013.01); *G06F 2203/04103* (2013.01); *G06F 2203/04107* (2013.01); *G06F 2203/04111* (2013.01); *G06F 2203/04112* (2013.01); *Y10T 428/24942* (2015.01); *Y10T 428/265* (2015.01); *Y10T 428/31507* (2015.04); *Y10T 428/31544* (2015.04); *Y10T 428/31721* (2015.04); *Y10T 428/31786* (2015.04); *Y10T 428/31931* (2015.04); *Y10T 428/31935* (2015.04); *Y10T 428/31938* (2015.04)

(56) References Cited

U.S. PATENT DOCUMENTS

| | | |
|---|---|---|
| 8,779,432 B2 | 7/2014 | Yamazaki et al. |
| 2002/0018883 A1* | 2/2002 | Okazaki ............... B32B 27/08 428/220 |
| 2002/0192445 A1* | 12/2002 | Ezzell ............... H05K 3/462 428/209 |
| 2003/0124265 A1 | 7/2003 | Bellmann et al. |
| 2004/0119403 A1 | 6/2004 | McCormick et al. |
| 2004/0183958 A1 | 9/2004 | Akiyama et al. |
| 2005/0209404 A1 | 9/2005 | Sakurai et al. |
| 2008/0062142 A1 | 3/2008 | Furukawa |
| 2009/0002323 A1* | 1/2009 | Shiroishi ............... G06F 3/044 345/173 |
| 2009/0130607 A1 | 5/2009 | Slafer |
| 2009/0188726 A1* | 7/2009 | Chang ............... G06F 3/041 178/18.03 |
| 2010/0026865 A1 | 2/2010 | Tivarus et al. |
| 2010/0265195 A1 | 10/2010 | Watanabe |
| 2011/0032207 A1* | 2/2011 | Huang ............... G06F 3/044 345/174 |
| 2011/0050586 A1 | 3/2011 | Miller et al. |
| 2011/0244140 A1 | 10/2011 | Takano |
| 2012/0182249 A1* | 7/2012 | Endo ............... G01L 1/205 345/173 |
| 2012/0242613 A1* | 9/2012 | Hsu ............... G06F 3/044 345/174 |
| 2013/0056244 A1 | 3/2013 | Srinivas et al. |
| 2013/0120283 A1* | 5/2013 | Tung ............... B32B 37/12 345/173 |
| 2013/0216709 A1 | 8/2013 | Yamazaki et al. |
| 2014/0234664 A1 | 8/2014 | Yasumoto et al. |
| 2014/0242343 A1 | 8/2014 | Free et al. |

FOREIGN PATENT DOCUMENTS

| | | |
|---|---|---|
| CN | 102629169 | 8/2012 |
| CN | 202815764 | 3/2013 |
| CN | 103105964 | 5/2013 |
| CN | 203102217 | 7/2013 |
| CN | 203178950 | 9/2013 |
| CN | 203465692 | 3/2014 |
| CN | 203502934 | 3/2014 |
| JP | 2012226688 | 11/2012 |
| TW | 201133310 | 10/2011 |
| WO | 2012053731 | 4/2012 |

* cited by examiner

TOUCH PANEL AND MANUFACTURING METHOD THEREOF

The current application is a Continuation application of U.S. application Ser. No. 14/467,992, filed on Aug. 25, 2014, which claims a foreign priority to the Chinese Patent Application 201310454870.1, filed on Sep. 29, 2013, and the Chinese Patent Application 201410244190.1, filed on Jun. 4, 2014. The entire contents of the above-referenced applications are incorporated herein by reference.

FIELD OF THE INVENTION

The present invention relates generally to touch panel technology. In particular, it relates to a touch panel with a buffer layer and the manufacturing method thereof.

BACKGROUND OF THE INVENTION

In today's consumer electronics market, touch panel has been applied to a wide variety of different electronic products, such as smart phones, normal mobile phones, tablet PCs, notebook computers and etc. In addition, the market increasingly demands new types of touch panel that is stronger, thinner, lighter, and less expensive.

Touch panel is currently one of the most popular technology that has been used various devices as mentioned above. One major reason counts for its popularity is that touch panel is able to provide a more intimate and intuitive experience for a user, which has eliminated the requirements for the physical facilities, such as mouse or key board, in between the working device and the user. As the user can directly perform operations or make instructions via the objects displayed on the screen, the touch panel is able to provide the user with a humanized operation interface between the users and the electric products.

However, with the increasingly higher demand for the touch panel that is with a thinner and lighter structure and a lower production cost, the structures and manufacturing processes of the current touch panels need to be further improved. Therefore, one objective of the present invention is to provide a touch panel that is manufactured through a new method, which allows it to be not only thinner, but also with desirable appearance and low costs.

DETAIL DESCRIPTIONS OF THE INVENTION

Figure 1:
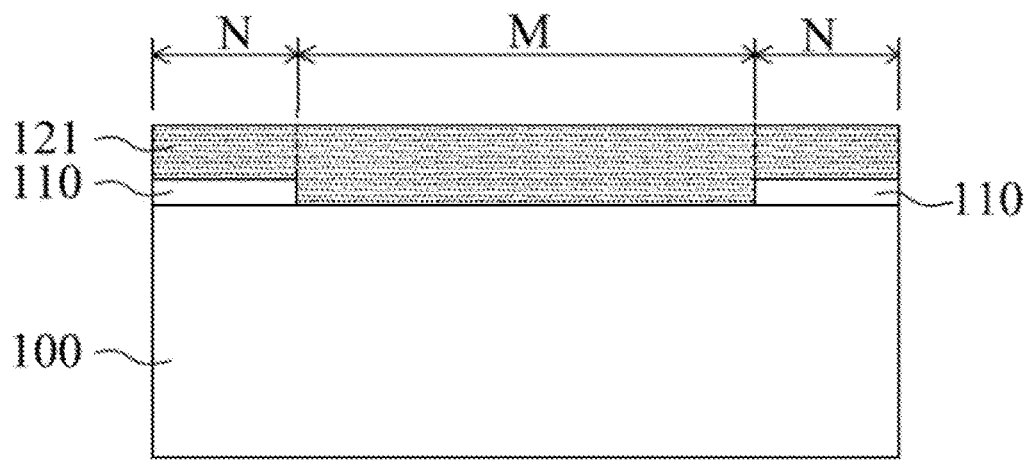
FIGS. 1-8 are the illustrations of the procedure steps of the manufacturing process of one embodiment of the present invention.

All illustrations of the drawings and exemplary embodiments are for the propose of describing selected versions of the present invention, and are not intended to limit the scope of the present invention. Moreover, in order to show the various elements clearly in the respective figures. their illustrations are only for the purpose of demonstration or indication, and thus are not drawn to scale.

The present invention has provided a touch panel and its manufacturing method. It has met the needs for a touch panel that is with a thinner and lighter structure and a lower production cost.

A manufacturing method of touch panel comprises the steps set forth below: S1 forming a film layer on a first plate; S2: forming a buffer layer on said film layer; S3 forming a sensing layer on said buffer layer: S4: forming a second plate on said sensing layer; S5, removing said first plate from said film layer; S6: attaching a cover on said film layer by a binding layer, and said binding layer being between said cover and said film layer: and S7: removing said second plate.

In addition, the present invention has also provided a touch panel produced via the foregoing manufacturing method. It comprises, in order, a cover, a binding layer, a film layer, a buffer layer, and a sensing layer, said film layer being on top of said cover, said buffer layer being on top of said film layer, said sensing layer being on top of said buffer layer, and said binding layer being in between said cover and said film layer.

As mentioned above, the present invention has provided a touch panel and the manufacturing method thereof. Two plates, namely the first plate and the second plate, have been introduced into the manufacturing process of the present invention. Albeit they are not a part of the final product, they actually provide critical functions to the formation of the touch panel disclosed in the present invention. With the supporting effect from the first plate, a sensing layer is formed on top of the film layer, and then the first plate is removed. And later on with the transferring effect of the second plate, the film layer, along with the sensing layer attaching to it, is attached to the cover. In this way, the formed touch panel is with a thinner and lighter structure and a lower production cost.

Besides, in regard to the plate that has been providing critical supporting effect to the respective layers during the manufacturing process of the touch panel, an adhesion promoter has been introduced between the plate (which is usually a glass plate) and the film layer. With its specific characteristic, such an adhesion promoter helps to maintain the tight attachment between the film layer (which could be made of certain organic materials, such as polyimide (PI)) and the plate (usually a glass plate), since the adhesion effect between these two types of materials is quite weak. Later on, prior to the removing procedure of the first plate, the adhesion promoter, due to its unique property, can be stripped of its adhesive ability, which result to a very weak attachment between the first plate and the film layer. In this way, it helps to separate (peel off) the first plate from the film layer (and other layer formed on the film layer), which it previously helped to bond together.

Moreover, the sensing layer is located on one side of the film layer, whose the other side is attached to the cover. In this way, during the future process of attaching a flexible circuit board to the sensing layer, it helps to prevent the foregoing process from affecting the flatness of the attachment between the film layer and the cover.

Further, a buffer layer has been introduced between the film layer and the sensing layer. This buffer layer, with its particular properties, helps to buffer the striking differences on many crucial properties between the film layer and the sensing layer, for example, their differences on the index of refraction and the coefficient of thermal expansion (CTE). With the existence of such a buffer layer between the film layer and the sensing layer, the negative effects from the formation of the sensing layer to the film layer, as well as the stress derived from the removal of the first plate to the sensing layer, have been significantly reduced.

Furthermore, since the film layer, in the present invention, has been made of certain unique organic materials (such as PI), it can be made of a very thin layer (can be as thin as a couple of microns) and meanwhile, retains its advantageous characteristics, for example, the desired strength, toughness and thermostability. This technical feature greatly helps to reduce the thickness of the touch panel of the present invention.

In reference to the accompanying drawings and exemplary embodiments, the present invention will be further described below in more details. It is noted that concerning the description that one component is located on top of or below another component, it comprises the embodiments that theses two components are in contact with each other, and the embodiments that a third component is located in between these two components. Further, in order to make the illustrations more helpful to understand the critical novel features of various embodiments of the present invention, the components in the figures are not drawn to scale.

In reference to FIGS. 1-8, the production process of one embodiment of the touch panel manufacturing method of the present invention has been described sequentially. As shown in FIG. 1, a first plate 100 is firstly provided; next a film layer 121 is formed on top of the first plate 100. In this case the first plate 100 functions as a mechanical supporter for the structure formed in the following steps. It can be a transparent or opaque plate, such as a piece of glass plate. Due to the fact that this first plate is not a constitute component of the final touch panel product, it can be used with a relatively low cost material, as long as such material is able to provide the necessary mechanical supporting function. For instance, instead of using the chemically strengthened glass, the first plate can be just a simple raw glass, which helps to reduce the manufacturing costs of the touch panel disclosed in the present application. In addition, as would be described later, after later removed from the formed touch panel, the first plate can be next recycled as the first plate in the formation of a new touch panel, which has further lower the production costs. Further, it is noted that the first plate in the present invention is not limited to glass, it can be any other suitable material that is able to provide a proper mechanical support.

Concerning the film layer 121, it could be in a single layer or multiple layer structure, or a stacking structure that comprises a lower layer formed by a material with releasing capability and an upper layer formed by another material without releasing capability. The releasing capability hereinafter refers to the removal of the first plate (or the second plate) from the layer (such as the film layer) that it is previously attached to. Instead of the conventional glass material, the film layer of the present invention can be made of a variety of suitable organic materials, such as the previously mentioned polyimide (PI).

The materials that can be used to form the film layer 121 include, but are not limited to, polyimide (PI), polypropylene (PP), polystyrene (PS), acrylonitrile-butadiene-styrene (ABS), polyethylene terephthalate (PET), polyvinyl chloride (PVC), polycarbonate (PC), polyethylene (PE), polymethyl methacrylate (PMMA), polytetrafluoro ethylene (PTFE), cyclic olefin copolymer (COP) or any combination of the foregoing.

In addition, the film layer can be formed by coating or any other suitable method. In one embodiment, the film layer is formed by coating process. For example, a solution including material disclosed above is applied to the first plate and then cured to form the film layer. In one embodiment of the present invention, the first plate 100 is disposed on a movable stage, and the solution including above material with specific proportion is applied to the first plate 100 by slit nozzle, dipper or other applying tool and then spread evenly by using a coating knife, rotating the stage other tool. The solution is heated or baked to volatilize solvent and/or polymerize precursors and/or monomers, and then a film layer is formed. In addition, the thickness of the film layer could be controlled by adjusting the speed of moving the stage and speed of applying the solution, which may be achieved by adjusting the pressure of the chamber and modifying the viscosity of solution. The process of heating and baking, may include several heating steps with different temperature, such as one pre-heating step with lower temperature and one heating step with high temperature, or one gradient heating step. In one embodiment, the film layer is made of polyimide, and the solution may include soluble polyimide (SPY) and organic solvent or polyamide acid (PAA) and organic solvent. The polyamide acid is the precursor of the polyimde. The organic solvent includes dimethylacetamide (DMAC), N-Methyl-2-Pyrrolidone (NMP), 2-Buthoxyethanol (BC), γ-butyrolactone (GBL), and etc. The formation process of the film layer 121 is not limited on this issue. The film layer may be formed by chemical vapor deposition (CVD), spray method or other suitable method. In other embodiment, the film layer is formed by direct pressing the film layer on the first plate 100.

The film layer 121 can be made of polyimide (PI) with chemical modifications on its chain length and/or functional groups, and/or physical modification on its surface microstructure, so that it does not have a significant hydrophilic property, which may compromise its function or appearance. In general, the longer its chain length is, the stronger its hydrophilic ability is. In such a composition, various length of PI chain would render the PI polymer different viscosities, which can be adjusted according to the specific requirement. The PI polymer may be further modified by groups that do not have a significant hydrophilic property, such as groups containing halogen. The film layer 121 made of fluorine containing polyimide comprising a few advantages. The light with a short wavelength cannot travel through the film layer. Accordingly, light (10 nm-400 nm) will be absorbed, rather than pass through to reach the critical sensing layer. In this way, the film layer has further provided an effect to protect the sensing layer from the harmful UV light. In addition, it has a high transparency and a low water absorbance. The latter ensures that during the procedure of wet etching the sensing layer, the film layer does not swell, which helps to produce a touch panel product with better appearance. Moreover, during an aging test, it does not absorb water; which would be beneficial to extend the service lives of touch panel components.

In addition, the thickness of the film layer disclosed in the present invention is significantly thinner than the film layers made by conventional materials. In one embodiment of the present invention, the thickness of the film layer is usually within the range from about 0.1 μm to 15 μm and preferably within the range of 2 μm to 5 μm. It is also noted that the foregoing is not a limiting range of the film layer of the present invention. The film layer 121 is usually thinner than the normal glass plate or conventional film substrate; and the film layer 121 within such thickness range comprises desired mechanical properties, including strength, toughness and thermostability, as well as desired optical properties, such as transmittance rate. Therefore, in the present invention, through the adoption of a thinner film layer, it has significantly reduced the thickness and weight of the touch panel, and meanwhile, it still retains excellent, optical properties and a desired product appearance.

In this embodiment, the film layer 121 can be adhered to the first plate 100 through a first adhering layer 110. As already mentioned, the adhesion force between the first plate (glass) and the film layer (organic polymer) is so weak that they cannot attach to each other tightly by themselves. Therefore, in order to improve the attachment between the first plate and the film layer, a particular adhering layer (adhesion promoter) has been provided between them.

The first adhering layer 110 is an adhesive comprising both pro-organic functional groups and pro-inorganic functional groups. More specifically, when the first plate 100 adopts glass or other inorganic materials and the film layer 121 adopts polyimide (PI) or other organic materials, the first adhering layer 110 would comprise different functional groups, which allow it to hold the first plate 100 (inorganic) and the film layer 121 (organic) on its two sides, respectively. In this way, it is capable of tightly fixing the film layer 121 onto the first plate 100. In one embodiment, the first adhering layer 110 is formed by coating a liquid adhesive, on the first plate 110 and then heating/baking the liquid adhesive until the first adhering layer 110 is formed. During the step of baking, the composition in the liquid adhesive can cross-link the first plate, which results in better adherence. Afterwards, when a subsequent baking process is performed during the step of forming the film layer, the first adhering layer can also cross-link the film layer 121, which facilitates a better adherence of film layer 121 on the first plate 100.

Figure 5A:
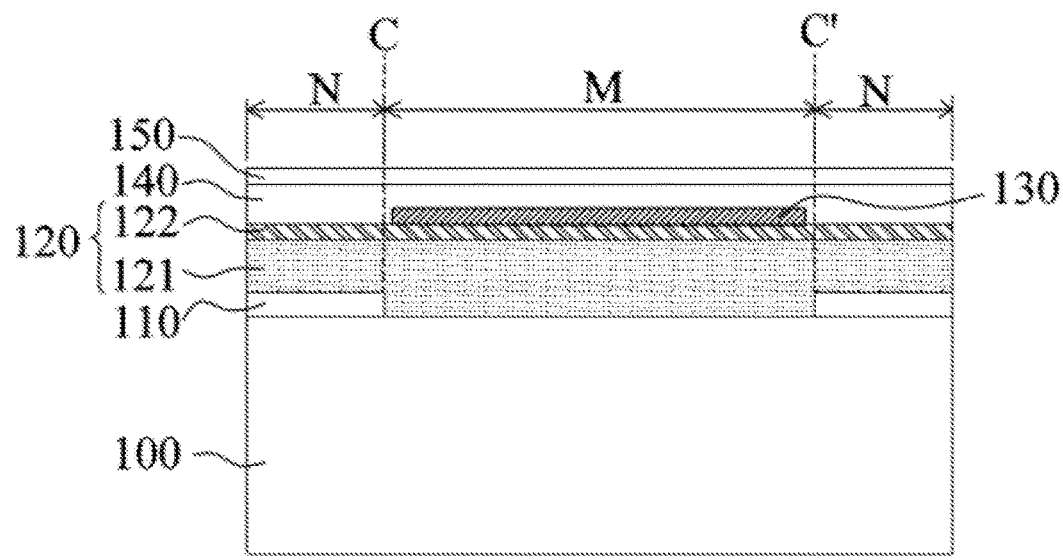
Figure 5B:
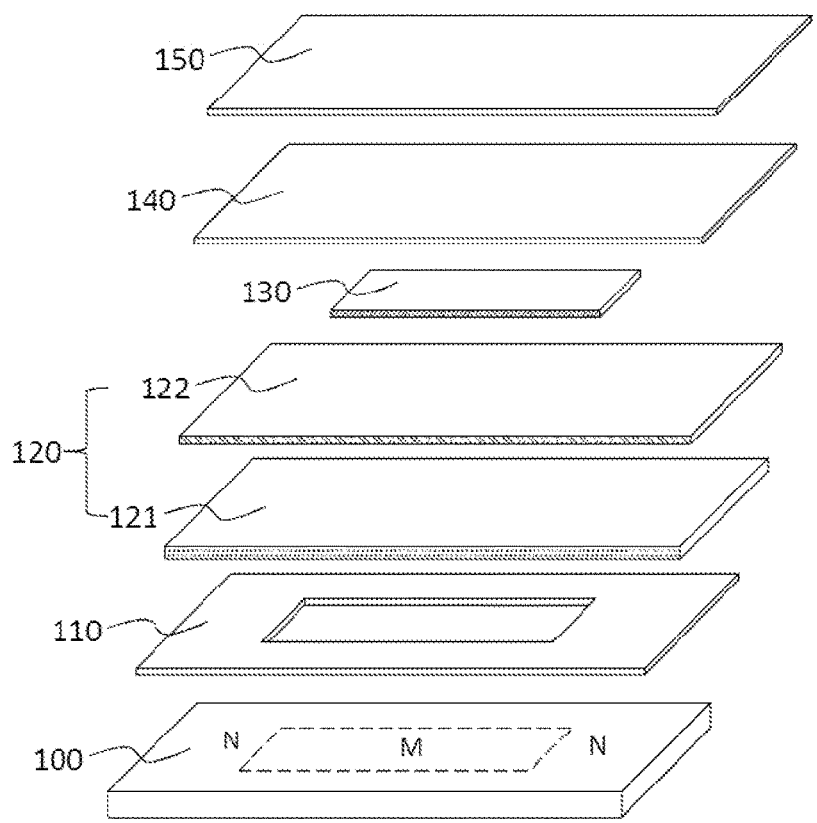

The first adhering layer 110 can be a continuous sheet-like layer between the first plate and the film layer. Alternatively, the adhering layer 110 can be in a frame like shape, which is located only on the periphery of the first plate 100. Accordingly, in the periphery region, the adhering layer 110 works to hold the first plate 100 and the film layer 121 together tightly: in addition, in the central region surrounded by the periphery, since no adhering layer present, the first plate 100 (glass or other inorganic, material) and the film layer 121 (PI or other organic material) are only loosely attached to each other. In such a fashion, it can not only ensure secure connections between various layers, but also make the future procedure of peeling off (first plate 100) become much easier. As shown in FIG. 5A and FIG. 5B, which is an exploded view of FIG. 5A, the first adhering layer 110 is located in the peripheral area N of the first plate 100. In this way, the bonding between the film layer 121 and the first plate 100 via the first adhering layer 110 at the peripheral area N is relatively strong; whereas in the areas other than the peripheral area N (such as the central area M), where no first adhering layer 110 exists, the bonding between the film layer 121 and the plate 100 is relatively low. Accordingly, during the production process the film layer 121 not only can adhere to the first plate 100 tightly through the first adhering layer 110 to ensure security, but also, during the process of peeling off, it can be easily removed from the first plate 100 after the first adhering layer 110 is removed. The particular removing method will be described in details later.

As mentioned previously, in other embodiments, it is also possible that the first adhering layer 110 is made to cover the entire area of the first plate 100. And the film layer 121 is formed on top of the first adhering layer 110. In particular, with such design, the first adhering layer 110 could be made by a material with variable adhering property. More specifically, during the process of formation, the first adhering layer 110 has a relatively strong adhering ability to the first plate 100. Later on, prior to the procedure of removing the first plate 100, via the approach of soaking the first adhering layer 110 in a specific solution or temperature treatment, its adhering ability will be significantly reduced, which helps to peel the first plate 100 off from the film layer 121.

Figure 2:
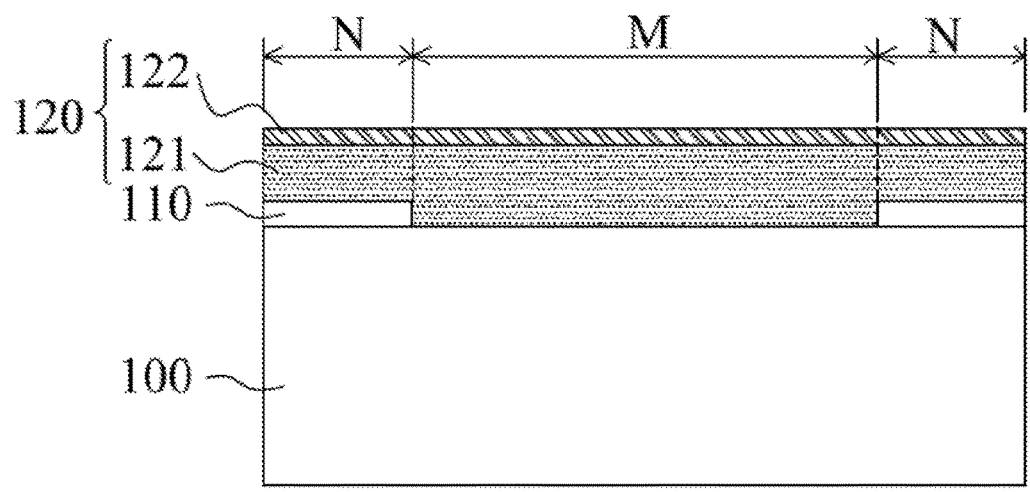

Next, as shown in FIG. 2, a buffer layer 122 is formed on top of the film layer 121. The buffer layer can be made of a transparent insulating material. In one embodiment of the present invention, the buffer layer 122 is made of silicon dioxide (silica), and is formed by the approach of chemical vapor deposition (CVD), printing, lithography or other suitable methods. In another embodiment of the present invention, the buffer layer can be made of material which has refractive index matched with that of the sensing layer. For example, the buffer layer may be made of titanium oxide (including, but not limited to $TiO_2$, silicon oxide (including, but not, limited to $SiO_2$, zirconium oxide (including, but not limited to $ZrO_2$), tantalum oxide, tungsten oxide, yttrium oxide, cerium oxide, antimony trioxide, niobium oxide, boron oxide, cerium fluoride, magnesium fluoride, calcium fluoride or a combination thereof. In yet another embodiment of the present invention, the buffer layer 122 may comprise an inorganic material and an organic material. The inorganic material can be selected from titanium oxide (including, but not limited to $TiO_2$), silicon oxide (including, but not limited to $SiO_2$), zirconium oxide (including, but not limited to $ZrO_2$),), tantalum oxide, tungsten oxide, yttrium oxide, cerium oxide, antimony trioxide, niobium oxide, boron oxide, $Ti_xNb_yO$, aluminum oxide, zinc oxide, indium oxide, aluminum fluoride, platinum fluoride, cerium fluoride, magnesium fluoride, calcium fluoride, aluminum oxyfluoride and magnesium oxyfluoride, and combination of the foregoing. The organic material can be polymer or resin; more specifically, such as acrylic resin, polymer, polyimide (PI), polypropylene (PP), polystyrene (PS), acrylonitrile-butadiene-styrene (ABS), polyethylene terephthalate (PET), polyvinyl chloride (PVC), polycarbonate (PC), polyethylene (PE), poly methacrylate (PMMA), polytetrafluoro ethylene (PTFE), cyclic olefin copolymer (COP), polyester, phenoxy resin, silicone rubber, epoxy, poly(acrylamide) (PAM) poly (vinyl alcohol) (PVAL), poly(acrylic acid) (PAA), poly (ethyleneimine) (PEI), per fluoroalkoxy polymer resin (PFA), perfluorosulfonic acid, phenolics (PF), phenoxy, phenylene ether/oxide, poly paraphenylene terephthalamide, poly(N-vinyl pyrrolidone), poly(propylene fumarate), cellophanepoly(vinylidene fluoride-trifluoroethylene), polyallyl phthalate, polyamide (PA), polyanhydrides, polyamideimide, polyarylate, polyarlether polyarylsulfone, polybenzimidazolepolybutylene (PB), polybutylene terephthalate (PBT), polybutylene, polycaprolactone, polychlorotrifluoroethylene (PCTFE) perfluoropolyether (PEPE), polydimethylsiloxane (PDMS), polyepoxide, polyester (PEs), polyetheretherketone (PEEK), polyetherimide (PEI), polyetherimide, polyethersulfone (PES), polyethylenetetrafluoroethylene (ETFE), polyethyleneoxide, polyglycolic acid (PGA), polyglycolide, polyisobutene, polyisoprene, polyketone, polylactic acid (PLA), polyllyl diglycol carbonate monomer, polyrnethyl pentene (PMP), polymethylpentene, polyoxymethylene (POM), polyphenyl ether (PPE), polyphenylene vinylene, polyphenylene, polypropylene (PP), polypropylene, polystyrene (PS), polystyrene, polysulfide, polysulphone (PSU), polyurethane (PO), polyvinyl, polyvinyl carbazole, polyvinyl fluoride (PVT), polyvinyl pyridine, polyvinylidene chloride (PVDC), polyvinylidene fluoride (PVDF), thermoplastics, thermosets, elastomers, pentacene, poly(3,4-ethylenedioxythiophene) (PEDOT), poly(styrenesulfonate) (PSS), poly(3-hexylthiophene) (P3HT), poly(3-octylthiophene) (P3OT), poly(C-61-butyric acid-methyl ester) (PCBM), poly[2-methoxy-5-(2'-ethylhexyloxy)-1,4-phenylene vinylene] (MEH-PPV), Poly(vinyl acetate) (PVAc). Poly(Vinyl pyrrolidone) (PVP), Poly(NN-dimethylacrylamide) (PDMA), Poly(methyl methacrylate-comethacrylicacid) P(MMA-co-MAA), Trogamid, Nylon-Trogamid-T, Poly(aclylic acid) (PAA) and etc.

Furthermore, in the present invention, the organic material can co-exist with the inorganic material. For example, in a hybrid matelial, an organic material could be mixed with an inorganic material at the nanometer level, so as to form a new molecular composite material. In such molecular composite material, the binding may be formed via intermolecular forces, including van der Waals force, hydrogen bond, ionic bond and covalent bond. Accordingly, the property of the final hybrid material could be the synergy of both inorganic properties and organic properties, which helps to meet the specific requirements for many highly desired performances. Another example would be mixing the organic material and the inorganic material homogeneously or heterogeneously. Another example would be employing a coupling agent, on an inorganic material in order to modify its surface characteristics. Another example would be forming a specific organic-inorganic mixture, such as inorganic particles capped by an organic material, or inorganic particles embedded in an organic layer.

The co-presence of these two different materials render the buffer layer a good adhering ability to both organic and inorganic materials, so as to ensure that the buffer layer 122 can fit with different film layer materials. In the present invention, the buffer layer can be made of both organic material and inorganic material, as being described in detail above. In comparison to the buffer layer formed by a single type of material, the buffer layer formed by such mixed materials can fit with different requirements for the appearance of touch panel, via the selection of various materials with different indices of refraction.

In addition, with adjusting the index of refraction and thickness of the buffer layer 122, it is possible to make its index of refraction match the indices of refraction of the layer on top of it and the layer below it. In this way, it can improve the optical transmission properly of the touch panel, so as to make the produced touch panel with a more desirable appearance. For example, in the case a buffer layer 122 has an index of refraction $n_1$, a film layer 121 has an index of refraction $n_f$ and a sensing layer has an index of refraction $n_T$, then $n_1$ should be greater than $n_f$, but is smaller than $n_T$, i.e. $n_f < n_1 < n_T$: and preferably, it would be close to the value of the square root of the product of $n_f$ and $n_T$, i.e., $n_1 \approx \sqrt{n_f \times n_T}$. In this way, the optical properties, such as index of refraction, of the three layers (sequentially, film layer, buffer layer and sensing layer) arranged in order, either gradually increasing or gradually decreasing. As a result, light can travel smoothly through these three layers without a big sudden change, which makes the formed touch panel looks more appealing.

Moreover, the buffer layer 122 is also capable of functioning as a buffer to reduce the mechanical stress generated between the film layer and the sensing layer located on two sides of the buffer layer. There is particularly important in certain situations, such as significant temperature increase or decrease, or peeling the glass plate off. As described previously, the film layer may be made of an organic material, such as polyimide (PI). On the other hand, the sensing layer is usually made of inorganic materials. In this regard, the PI film layer would have a very high coefficient of thermal expansion (CTE); whereas the sensing layer may have a pretty low CTE. In addition, the mechanical characteristics of the PI film layer and the sensing layer are dramatically different, too. Therefore, in the situations mentioned above, a significant stress could be generated between the film layer and the sensing layer. Such a stress may not only negatively affect the appearance of touch panel, but also compromise the touch panel's function. With the introduction of a buffer layer between the film layer and the sensing layer, via the buffer layer's buffering function, the potential stress generated between the film layer and the sensing layer would be effectively minimized. Therefore, the introduction of a buffer layer between the film layer and the sensing layer can significantly improve the quality of the formed touch panel.

Based on the foregoing, the buffer layer should be formed by a material whose CTE value is between the film layer and the sensing layer, and make sure that it is not close to one of them against the other. For example, if the PI film layer's CTE is about 1000, while the sensing layer's CTE is a one digit value, then the desired CTE value of the buffer layer would be a number of three digits and should not be too close to the sensing layer, i.e., not in the range approximately between 1 to 100, nor be too close to the film layer end, i.e., not within the range greater than 900. So, preferably, the CTE value of the buffer layer would be close to the midpoint, between the film layer and the sensing layer. If the difference between film layer's CTE and sensing layer's CTE is 100%, then the CTE of the buffer layer in neither the 10% close to film layer's CTE nor the 10% close to the sensing layer's CTE is desirable. This is another reason why the buffer layer may be made of partial inorganic material and partial organic material, which helps to adjust the mechanical characteristic (such as CTE) of the buffer layer.

Further, the thickness of the buffer layer 122 is usually within the range of 10 angstrom (Å) to 3000 angstrom (Å). In addition, the buffer layer 122 can be formed through the process of printing, coating or lithography. In the case when the buffer layer 122 is formed through such a printing or coating approach, it has a reduced stress between subsequently formed sensing layer and film layer, so as to reduce the sensing layer deformation induced by such stress. In one embodiment, the buffer layer 122 is formed by the following steps. A liquid including material described above is coated on the first film layer 121, cured by UV-light, and then baked. Finally, the solid buffer layer 122 is formed on the film layer 121.

The buffer layer 122 and the film layer 121 together have formed a bearing layer 120 on top of the first plate 100. In comparison to the film layer 121, the buffer layer 122 has a relatively higher hardness. In this way, the bearing layer 120 formed by a buffer layer 122 that has a higher hardness along with a film layer 121 that has a better flexibility will have both good releasing ability and good bearing ability, which would further improve the reliability of the components subsequently formed on the bearing layer 120. It needs to be noted that in comparison to the buffer layer 122 formed by a single type of material (such as silicon dioxide), the buffer layer formed by the foregoing mixed materials has the advantages to adjust the stress of the buffer layer 122, thus during the releasing process, it helps to increase the stability of the entire touch panel structure. Although the bearing layer has better bearing ability than the film layer the critical supporting effect to the respective layers during the manufacturing process of the touch panel is still provided by the first plate or the second plate as mentioned above. In this way, the formed touch panel is with a thinner and lighter structure and a lower production cost. In another embodiment, the bearing layer 120 may be a single layer and will have both good releasing ability and good bearing ability, which would further improve the reliability of the components subsequently formed on the bearing layer 120.

Figure 3:
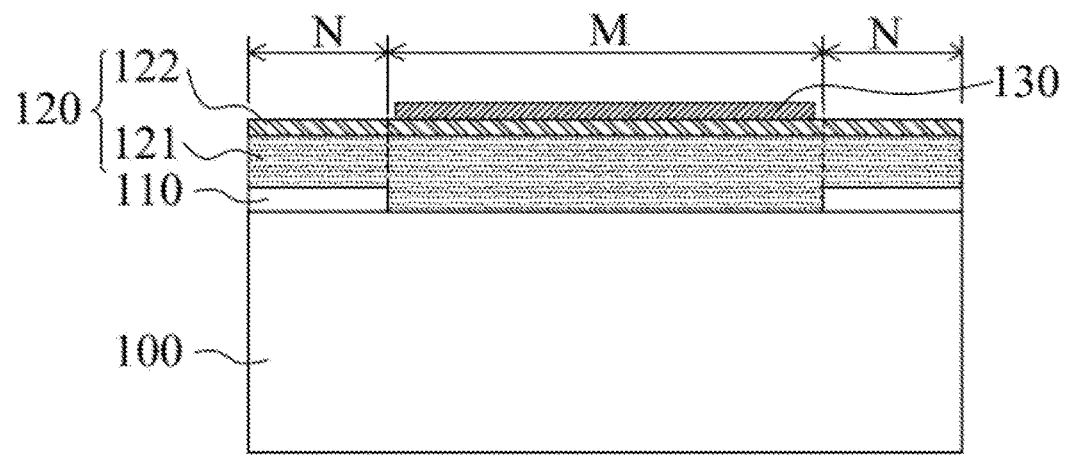
Figure 15:
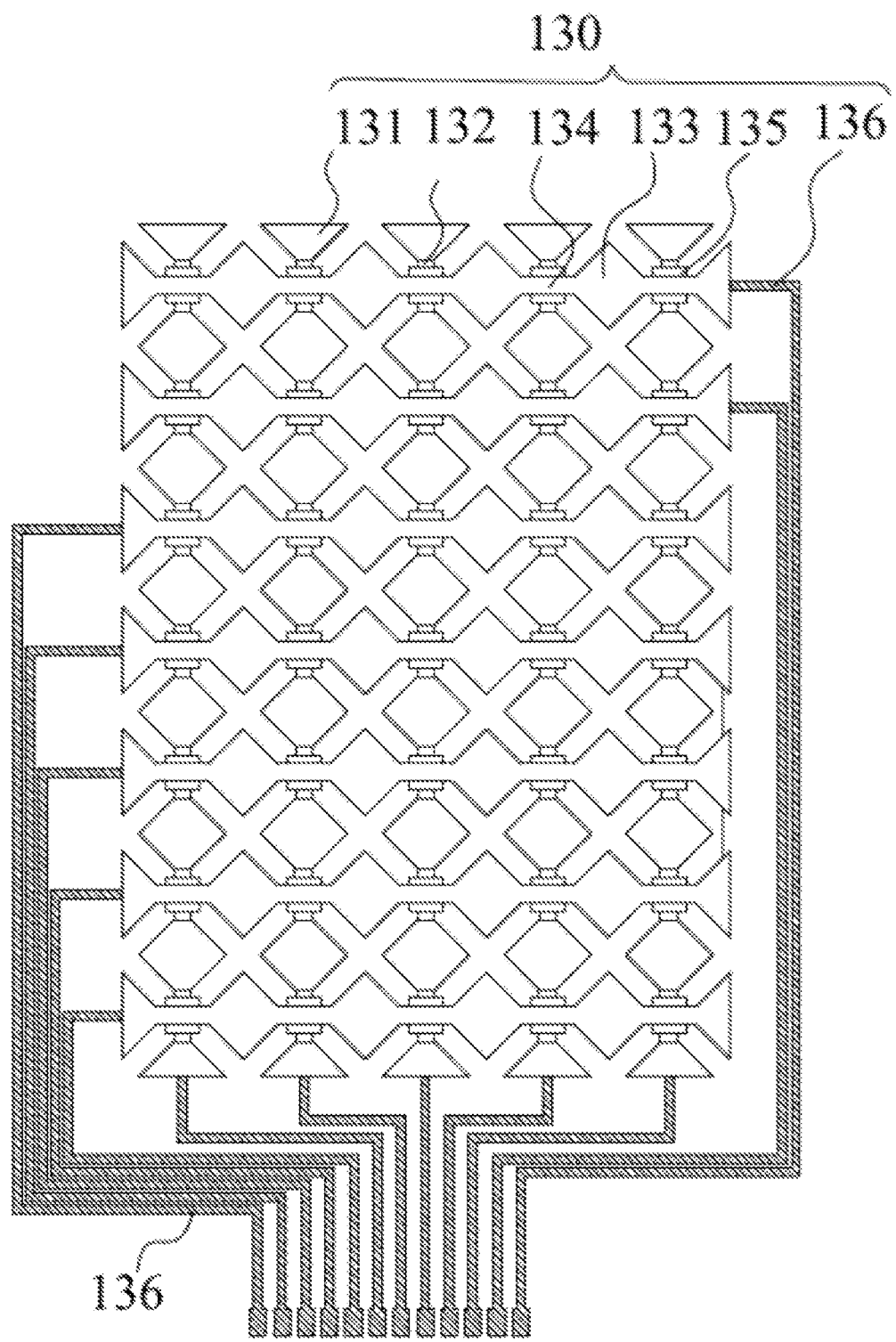
FIG. 15 is a structural view of the touching panel sensing layer of one embodiment of the present invention.

As shown in FIG. 3, a sensing layer 130 is formed on top of the buffer layer 122. The sensing layer 130 is located within the central area M of the first plate 100. As also shown in FIG. 15, which is a schematic structural view of touch panel sensing layer of one embodiment of the present invention. The sensing layer 130 comprises multiple pieces of first electrode block 131, which are disposed along a first direction; multiple lines of first wire 132 connect neighboring first electrode blocks 131 along the first direction, multiple pieces of second electrode block 133, which are disposed along a second direction: the multiple pieces of second electrode block 133 are arranged on both sides of the multiple lines of first wire 132; an insulating block 135 is formed on each of the multiple lines of first wire 132, and a second wire 134 connecting two neighboring second electrode blocks 133 along the second direction is formed on each of the insulating block 135; i.e., the insulating block 135 is located between the first wire 132 and the second wire 134, so as to ensure the insulation between the first wire 132 and the second wire 134, wherein, the first direction is different from the second direction, and preferably they are perpendicular to each other. It is noted that the structure of sensing layer is not limited to the mode shown in FIG. 15, for example, the sensing, layer is single layer in which sensing electrode blocks are formed in comb-shape, cross-shape, or wave shape. In another embodiment, the sensing layer is single layer in which the at least one of first sensing electrodes and second electrode have geocodes and are not overlap with each other. In another embodiment, the sensing layer is a multi-layer stack in which the first sensing electrodes, the second sensing electrodes, and insulator between two sensing electrodes are three different and respective sublayers.

The process of sensing layer 130 formation comprises the steps set forth below, first, forming the first wire 132 on the buffer layer 122; next, forming the insulating block 135 on each of the first wire 132; and finally forming the first electrode block 131, the second electrode block 133, as well as the second wire 134. Alternatively, in another embodiment of the present invention, first, forming the first electrode block 131, the second electrode block 133, as well as the first wire 132; next, forming the insulating block 135 on each of the first wire 132: and finally, forming the second wire 134 on the first wire 132.

In addition, the process of sensing layer 130 formation also comprises the steps of forming multiple signal lines 136; the first electrode blocks 131 located along, the same axial direction (i.e., first direction) forming a serial sensing electrodes via electric, connections between the first wire 132, which would further electrically connected to the corresponding signal line 136; the second electrode blocks 133 located, along the same axial direction (i.e., second direction) forming a serial sensing electrodes via electric connections between the second wire 134, which would further electrically connected to the corresponding signal line 136. The sensing signal generated from the first electrode blocks 131 and the second electrode blocks 133 is transmitted via the signal line 136 to a controller (not shown in the figures). The controller is able to calculate the location of the touching based on the sensing signal. It needs to be noted that the quantity and arrangement of the signal line 136 can be adjusted according to various sensing layer 130 structures; and are thus not limited to the mode shown in FIG. 15. More specifically, there are could be multiple convergence areas of the signal lines 136, and the signal lines 136 that connects the same serial sensing electrodes can adopt a mode of bilateral lead.

The first electrode block 131 and the second electrode blocks 133 are made of transparent conductive material, such as transparent conductive oxide, which may include indium tin oxide (ITO), aluminum doped zinc oxide (AZO), zinc oxide, antimony tin oxide (ATO), tin dioxide, indium oxide, or a combination of the foregoing. The first electrode block 131 and the second electrode blocks 1.33 may also be made of nano-silver, nano-carbon tube, metal mesh or other conductive material. The first wire 132, the second wire 134, as well as the signal line 136 can utilize the same transparent conductive material as that of the aforementioned electrode blocks; they may also utilize non-transparent conductive materials, such as metal and alloy, comprising gold, silver, copper, molybdenum, aluminum or a combination of the foregoing. The first electrode block 131, second electrode blocks 133, first wire 132 and second wire 134 can be formed via the processes of sputtering and lithography, or other method such as screen printing, spraying and etc.

It should be noted, concerning the touch panel of the present invention, in one preferred embodiment, the first electrode block 131, second electrode blocks 133, the first wire 132 and the second wire 134 are all indium tin oxide formed by the process of sputtering at low temperature, wherein the low temperature is about 20 to 80° C. In comparison to the sputtering at high temperature, the overall stress of the indium tin oxide formed via the process of sputtering at low temperature is relatively low, which makes it suitable for the subsequent step of first plate removal, as well as improves the stability of the touch sensing stack formed on top of the bearing layer 120.

More specifically, the first wire 132 is formed via sputtering and lithography at low temperature. At this stage, the formed first wire 132 is non-crystalline indium tin oxide; then performing baking to the first wire 132, so as to transform the non-crystalline indium tin oxide into a crystalline indium tin oxide; next, forming each insulating block 135 on the first wire 132; and then at low temperature, forming the first electrode block 131, second electrode blocks 133 and the second wire 134 via sputtering and lithography. Similarly, at this stage, the formed first electrode block 131, second electrode blocks 133 and the second wire 134 are all non-crystalline indium tin oxide; and finally, baking the first electrode block 131, second electrode blocks 133 and the second wire 134, so as to convert the non-crystalline indium tin oxide into crystalline indium tin oxide. The baking processing mentioned above is usually performed at a temperature equal to or greater than 180° C. and equal to or less than 350° C. and preferably greater than or equal to 220° C. and equal to or less than 240° C.

The step of baking the first wire 132 can avoid the formed first wire 132 being corroded by the etchant used in the formation of the first electrode block 131, second electrode blocks 133 and the second wire 134. In addition, it can increase light transmission, reduce impedance and improve electrical conductivity of the first wire 132. Similarly, the baking process to the first electrode block 131, second electrode blocks 133 and second wire 134 can increase light transmission, reduce impedance and improve electrical conductivity of the first electrode block 131, second electrode blocks 133 and the second wire 134.

In another embodiment of the present invention, the first electrode block 131, second electrode blocks 133 and first wire 132 are formed via sputtering and lithography at low temperature, at this stage, the formed first electrode block 131, second electrode blocks 133 and first wire 132 are all non-crystalline indium tin oxide; then performing baking to the first electrode block 131, second electrode blocks 133 and first wire 132, so as to transform the non-crystalline indium tin oxide into a crystalline indium tin oxide; next, forming each insulating block 135 on the first wire 132; and then forming the second wire 134, at this stage, the second wire 134 is non-crystalline indium tin oxide; and finally, baking the newly formed second wire 134, so as to transform the non-crystalline indium tin oxide into a crystalline indium tin oxide. The indium tin oxide disclosed in this embodiment is just an example for description, and should not limit the scope of the present invention.

Figure 4:
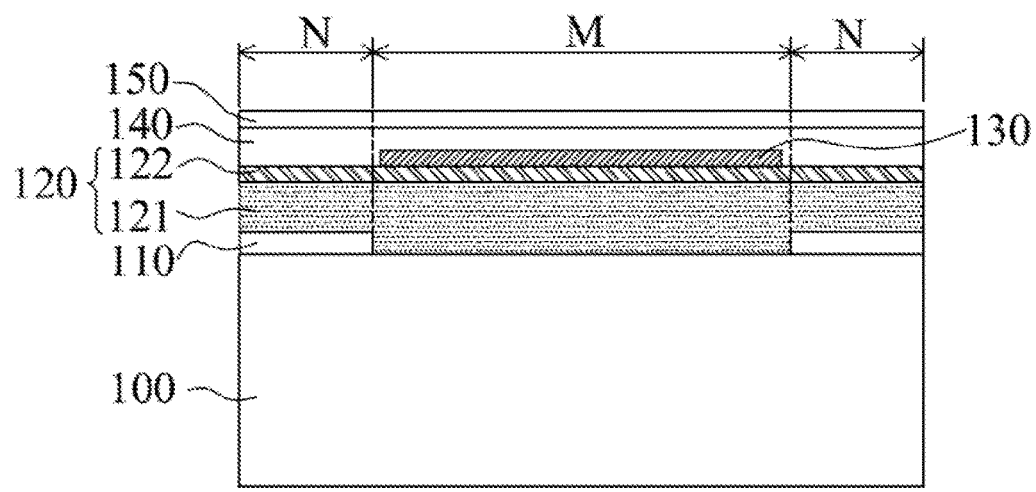

Next, in reference to FIG. 4, a second plate 150 is formed on the sensing layer 130. In addition, the second plate 150 is able to partially or even entirely cover the buffer layer 122. Via the second adhering layer 140, the second plate 150 is adhered to the sensing layer 130 and the buffer layer 122. The materials that can be used to make the second plate 150 include polyethylene terephthalate (PET) polymer or any other material that is able to support a film layer component and facilitate its transfer to a cover, including glass, cyclic olefin copolymer (COP, Arton), polypropylene (PP), and etc. The second adhering layer 140 can be a removable adhesive, and the second adhering layer 140 may comprise a non water soluble adhesive or any suitable material that is able to adhere two layers together and subsequently to be dissolved or removed via appropriate approaches. In one embodiment, the second plate 150 and the second adhering layer 140 can be integrated as a single-sided adhesive tape. The second adhering layer 140 has one surface facing the second plate 150 and one opposite surface facing the sensing layer 130. The adhesiveness of one surface of the second adhering layer 140 which faces the sensing layer 130 could be reduced or diminished by illumination, UV irradiation, heat, cold or the combination thereof, and meanwhile, under the same treatment, another surface of the second adhering layer 140 which faces the second plate 150 remains unchanged. Accordingly, during the step of removing the second plate, the second adhering layer 140 can be removed along with the second plate 150.

Figure 6:
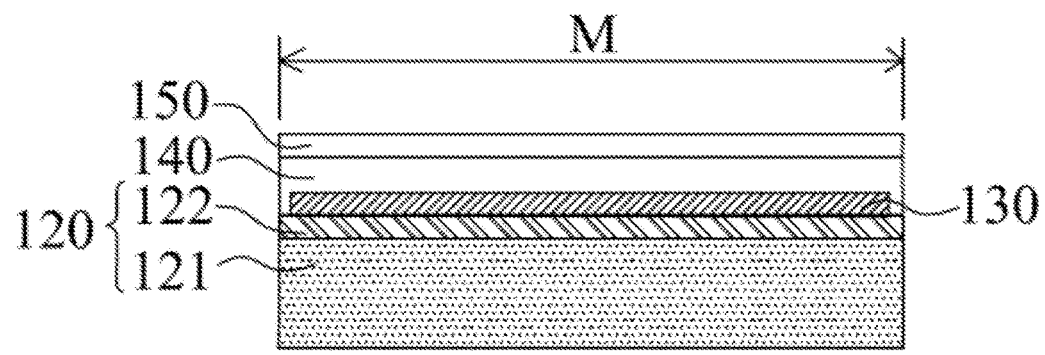

In references to FIGS. 5A, 5B and 6, the first plate 100 is removed from the film layer 121. As shown in FIGS. 5A and 5B, which is an exploded view of 5A, along the inner side of the first adhering layer 110, the first adhering layer 110 and the structure on top of the first adhering layer 110 (i.e., a part of the film layer 121, the buffer layer 122, the second adhering layer 140 and the second plate 150 corresponding the peripheral region N of the first plate) can be removed, i,e., cutting along the CC'line as shown in FIG. 5A. Next, the first plate 100 is removed from the film layer 121. Since the first adhering layer 110 that maintains the major adhering function has been removed prior to the removal of the first plate 100, it can reduce influence of the stress from the removal of the first plate 100 on the film layer 121 and the structures formed on the film layer 121. In addition, during the removing of the first adhering layer 110, the cutting parameters can be controlled, so as to ensure that the first plate 100 will not be damaged. In this way, the first plate 100 becomes reusable, which would help to reduce the production costs.

In one embodiment of the present invention, besides the first adhering layer 110 and the structure on top of the first adhering layer 110, the first plate 100's portion that is below the first adhering layer 110 is removed, along the inner side of the first adhering layer 110, i.e., along the CC' line as shown in FIG. 5A. Next the partially cut first plate 100 that corresponds to the central region M of the first plate 100 is removed from the film layer 121. Alternatively, in another embodiment, between the step of sensing layer 130 formation and the step of second plate 150 formation, along the inner side of the first adhering layer 110, cutting off the first adhering layer 110 and the structure on top of the first adhering layer 110; and at the same time, the first plate 100 is retained, and the first plate 100 will be removed after the formation of the second plate 150.

It needs to be noted, during removing the first plate 100, other measures could be taken to facilitate the releasing process, such as removing the first plate 100 from the film layer 121 via the measures of solution soaking heating, cooling, peeling by force or a combination thereof. In this regard, the solution can be water, alcohol, propylene glycol monomethyl ether acetate (PGMEA) solution, N-Methyl-2-pyrrolidone (NMP) and etc; with utilization of the heating or cooling treatment, the first plate 100 is heated or cooled, since the thermal expansion coefficient of the bearing layer 120 and that of the first plate 100 are different, a stress is generated, which will further facilitate the releasing.

Figure 7:
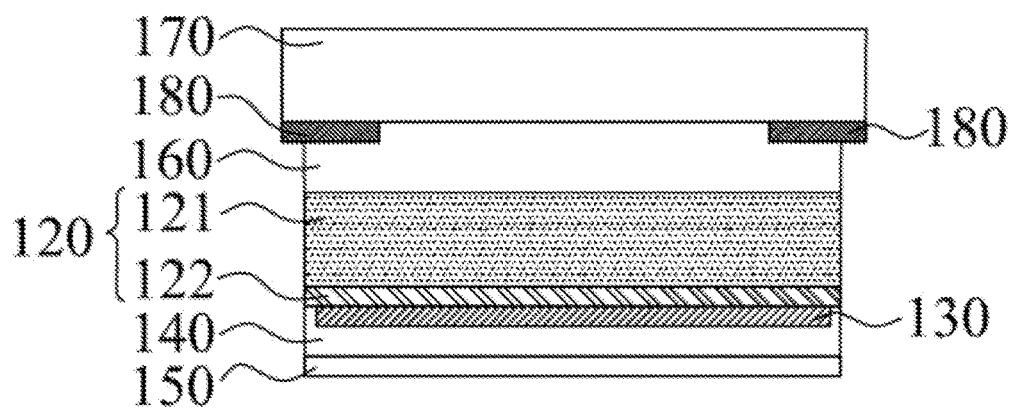

Next, in reference to FIG. 7, a cover 170 is attached to the film layer 121. The cover 170 and the film layer 121 can be made attached to each other tightly through stacking pressure from the binding layer 160 or other measures. Also, as the film layer 121 is located between the cover 170 and buffer layer 122, i.e., the layer stacking order would be, from top to bottom, cover 170, binding layer 160, film layer 121, buffer layer 122, sensing, layer 130, second adhering layer 140 and second plate 150. The cover 170 is able to protect the structures below it. It can be made of glass, polyimide (PI), polypropylene (PP), polystyrene (PS) acrylonitrile-butadiene-sryrene (ABS), polyethylene terephthalate (PET), polyvinyl chloride (PVC), polycarbonate (PC), polyethylene (PE), polymethyl methacrylate (PMMA), polytetrafluoro ethylene (PTFE) or other transparent materials. In order to increase the strength of the cover 170, the six sinfaces of the cover 170 may all be chemical strengthened, or two opposite surfaces of the cover 170 may be chemical strengthened and four lateral surfaces may be physically strengthened. The cover 170 could be formed by cutting the glass substrate into small pieces first which matches the size of one touch panel module and then chemically strengthening above pieces. Compared with the conventional method which the glass substrate is chemically strengthened first and then cut into small pieces, the cover 170 of the present embodiment of the claimed invention has improved edge strength and bulk strength. In addition, the cover 170 can be made of either hard material or flexible material. Moreover, the cover 170 may comprise two flat surfaces, two curved surfaces or one flat surface and one curved surface, such as 2.5D shape or 3D shape. Since the film layer component. (i.e., the bearing layer 120 combined with the sensing layer 130) of the present invention is thinner and more flexible than conventional touch assembly including one glass and one film or two films or two glasses as supporting substrates, the film layer component could be attached to the hard cover with various curvature or even a flexible cover and perform touching function well, which will further increase the freedom of touch panel design. The upper surface of the cover 170, namely the side that is opposing the side attached to the film layer 121, can be used as a touching surface of the touch panel. Furthermore, the binding layer 160 could be made of solid or liquid transparent optical glue or other suitable transparent bonding materials.

Moreover, on either side of the cover 170, a shield layer 180 may be provided and attached to the cover 170. The shield layer 180 is located on at least one side of the cover 170, so as to shield the signal line (136 shown in FIG. 15). In this way, the signal line will not been seen by a user from the upper surface of the cover 170. In one embodiment of the present invention, the shield layer 180 is located below the cover 170, i.e., it is located between the lower surface of the cover 170 and the film layer 121. In another embodiment, the shield layer 180 is located on the upper surface of cover 170, i.e., it is located on the side of the cover 170 opposing to the film layer 121.

Alternatively, the shield layer 180 can be a decoration film (Deco-film). Specifically, the Deco-film may include a transparent film and the shield mask, and the shielding mask is located around the peripheral area of the transparent film. The Deco-film can be either disposed on the upper surface of the cover, or used to replace the cover 170 and the shield layer 180. The material of the shield layer 180 can be color ink, color photoresist, or a combination of the two. Further, the shield layer 180 can be in either a single layer structure or a multiple layer structure. For example, the single layer structure may be a black ink layer. The multiple layer structure may be a stack of ink layer and photo resist layer, a stack of white ink layer and black ink layer, or a stack of white ink layer, black ink layer and photo resist layer.

Figure 8:
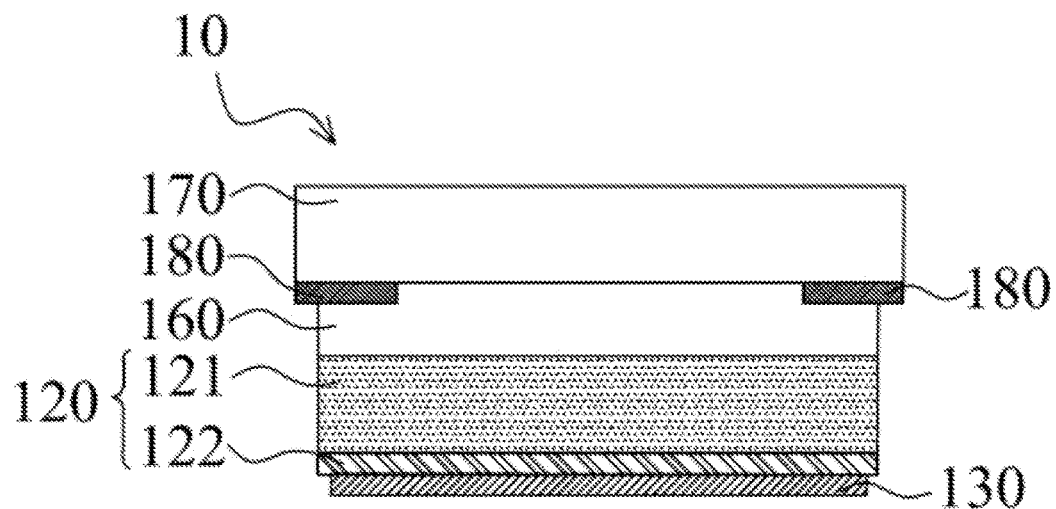

Finally, in reference to FIG. 8, the second plate 150 and the second adhering layer 140 are removed from the sensing layer 130. More specifically, the second adhering layer 140 is pre-treated, including optical treatment, heating, cooling treatments, or a combination thereof. For example, according to the various types of the materials for the second adhering, layer 140, respective treatments of UV irradiation, heating or cooling can be utilized to reduce the adhesion of second adhering layer 140. And then, the second plate 150 and the second adhering layer 140 are easily removed from the sensing layer 130. The particular removing method can be determined according to the material of second adhering layer 140. The present invention is not limited on this issue. Noteworthily, during the process of transferring the film layer 121 with the buffer layer 122 and the sensing layer 130 from the second plate 150 to the cover 170, preferably the second plate 150 is made of flexible material, and the cover 170 is made of rigid material, such as strengthened glass. By attaching flexible material to the rigid material, the yield rate of the transferring step will be improved, the thickness of the binding layer 160 will be reduced, and gas bubbles generated in the binding layer will be avoided.

A touch panel 10 as shown in FIG. 8 is finally formed via the steps mentioned previously. The touch panel 10 comprises the stacking structure from top to bottom, the cover 170, the binding layer 160, the film layer 121, the buffer layer 122 and the sensing layer 130, namely, the film layer 121 is next to the cover 170; the buffer layer 122 is next to the film layer 121; the sensing layer 130 is next to the buffer layer 122; the binding layer 160 is located between the cover 170 and the film layer 121. Further, the touch panel 10 may also comprises a shield layer 180. The shield layer 180 is located on at least one side of the cover 170. The structure, material and production method of the foregoing have already been disclosed previously. So, they will not be repeated hereinafter. The generated touch panel 10 can be applied into computer system, mobile phone, digital media player, ultrabooks wearable devices, in-vehicle computers and many other display devices with touch panel.

It is noted that following the completion of the steps as illustrated in FIGS. 1 to 8, a flexible circuit board with a controller can be further attached to the signal line 136 of the sensing layer 130 located on the connection position with an anisotropic conductive adhesive. In comparison to the approach of directly attaching the flexible circuit board after the step shown in FIG. 3, the present invention firstly completes the steps shown in FIGS. 1 to 8, and then attaches the flexible circuit board. It is easily understood that in such a way, it can avoid the issue that during the process of removing the first plate 100 or the second plate 150, the flexible circuit board might accidently fall off Therefore, it is helpful to improve the overall stability of the touch panel.

Figure 9:
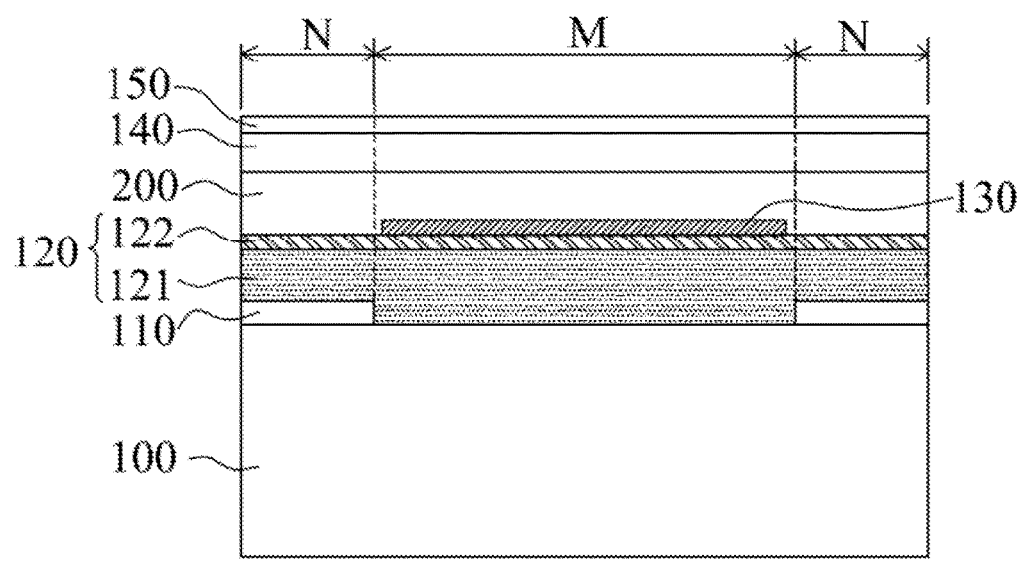
FIGS. 9 and 10 are the illustrations of the manufacturing process of another embodiment of the present invention.
Figure 10:
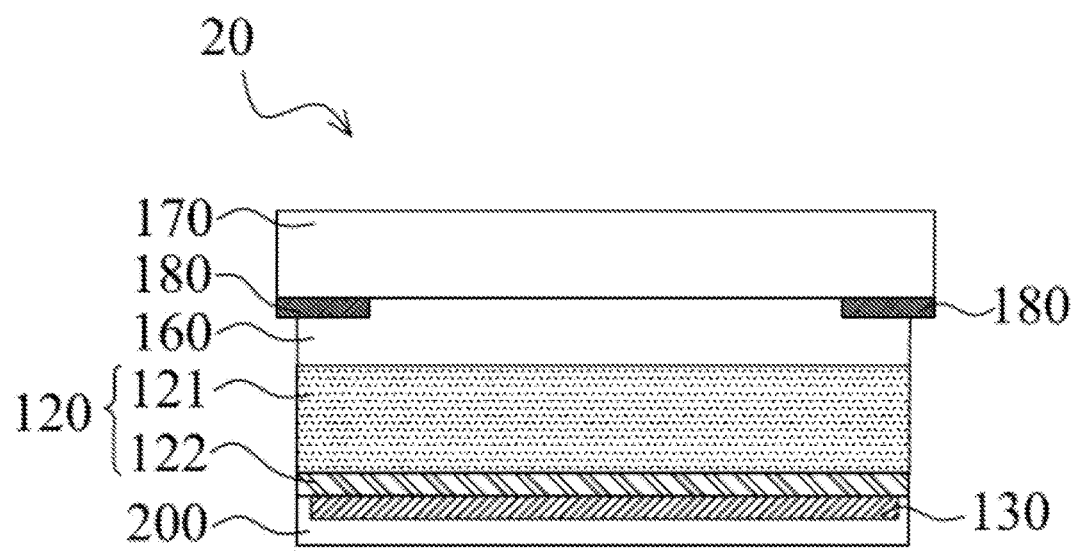

In reference to FIGS. 9 and 10, it has shown another embodiment of the forming method of the touch panel of the present invention. It is noted that, the step shown in FIG. 9 follows the step shown in FIG. 3. The steps prior to the step shown in FIG. 9 are identical to the steps shown in FIGS. 1-3. So, they will not be repeated herein. As shown in FIG. 9, post the formation of the sensing layer 130, the procedure further comprises the step of forming a protection layer 200 on the sensing layer 130. The protection layer 200 has protective effect to the sensing layer 130. It is able to reduce the negative effect on the sensing layer 130 from the removals of the second adhering layer 140 and the second plate 150. In addition, it can also reduce the damage to the sensing layer 130 from the air, water (vapor) or other corrosive substances in the environment. Moreover, the protection layer 200 needs to expose the connection position where the signal line connecting the flexible circuit board, which facilitates to connect to an external controller.

The protection layer 200 may be made of at least one of organic materials, inorganic materials, composite materials or polymer materials. Specifically, they include thermosetting resin, silica, photoresist, and other suitable transparent insulating materials. In one preferred embodiment of the present invention, the protection layer 200 may adopt a mixed material similar to that of the previous mentioned buffer layer 122, i.e., an organic material and an inorganic material. In another embodiment, the protection layer comprising, titanium dioxide ($TiO_2$), silicon dioxide ($SiO_2$), zirconium dioxide ($ZrO_2$) and the combination thereof, or a compound formed by titanium dioxide ($TiO_2$), silicon dioxide ($SiO_2$) and organic material(s). With adjustment of the refractive index and thickness of the protection layer 200, and in combination with the introduction of the buffer layer 122, it helps to improve the problem of undesired touch panel appearance, which is caused by the light reflection difference between the areas with electrode block and the areas without electrode block. For example, the surface of the protection layer 200 which is apart from the sensing layer 130 may be adhered to a display device so as allow the touch panel 10 to be combined with the display device. The protection layer 200 comprises a refraction index $n_2$, and preferably $n_2$ is within the range set by the upper and lower layers of the protection layer 200. In one embodiment, the protection layer 200 is located between the sensing layer 130 and an adhering layer which is used for attaching to the display device. In such a case, the refraction index $n_2$ of the protection layer 200 would be less than the refraction index $n_T$ of the sensing layer 130 but greater than the refraction index $n_A$ of the adhering layer; i,e., $n_A < n_2 < n_T$ and preferably, it would be close to the value of the square root of the product of $n_3$ and $n_T$ i.e., $n_2 \approx \sqrt{n_A \times n_T}$. In one preferred embodiment of the present invention, the thickness of the protection layer 200 can be 0.01 μn to 0.3 μm.

The protection layer 200 can be formed by the printing approach via convex plate or roller. The protection layer 200 formed in this way can help to reduce the stress between the subsequently formed sensing layer 130 and other layers, so as to improve the stability of the protection layer 200. And at the same time, it allows a conveniently removing of the second plate and the second adhering layer, and reduces stress. In one embodiment, the protection layer 200 is formed by coating, curing by UV light, and re-curing by heat. In other preferred embodiment of the present invention, based on the needs of the respective application, other approaches, such as sputter, chemical vapor deposition (CND), inkjet printing, slit coating, spin coating, spray coating or roller coating, can also be utilized to form the protection layer 200.

In reference to FIGS. 4-8, and steps following the step shown in FIG. 9 are similar to the steps shown in FIGS. 4-8; except that the second plate 150 and the second adhering layer 140 are formed on top of the protection layer 200. The first plate 100 and the first adhering layer 110 are firstly removed; and then the cover 170 is attached to the work piece; next, the second plate 150 and the second adhering layer 140 are removed, so as to form the touch panel 20, which further comprises the protection layer 200. As shown in FIG. 10, the touch panel 20 comprises, from top to bottom stacked the cover 170, the binding layer 160, film layer 121, buffer layer 122, sensing layer 130, and the protection layer 200. Concerning the structure, material and manufacturing method of the foregoing components, they have already been described previously, and thus will not be repeated herein.

Figure 11:
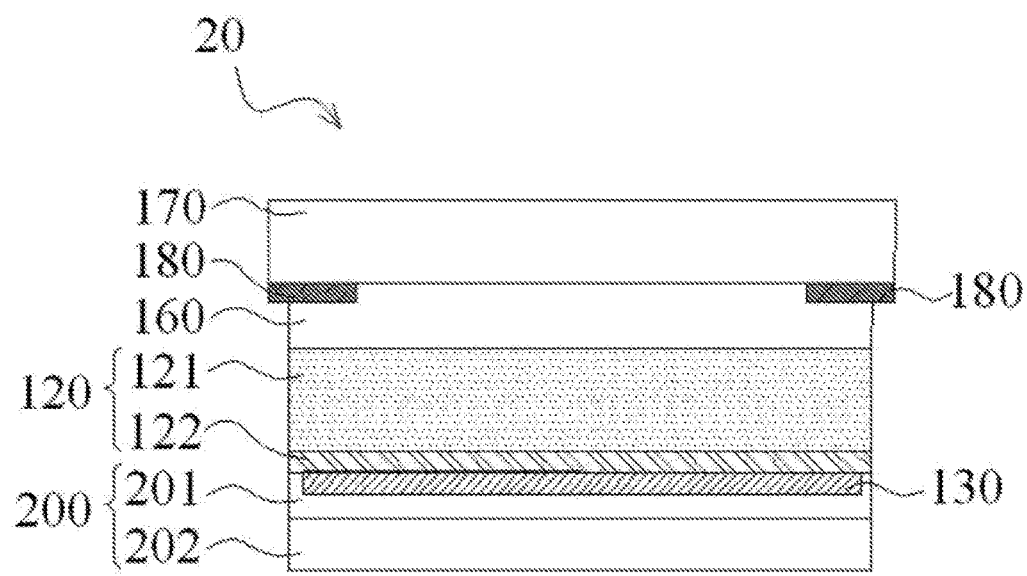
FIG. 11 is the illustrations of the manufacturing process of another embodiment of the present invention.

The protection layer 200 can be either a single layer structure or a multiple layer structure. In one embodiment, referring to FIG. 11, the protection layer 200 is a multi layer structure and includes a first protection layer 201 and a second protection layer 202. The first protection layer is between the sensing layer 130 and the second protection layer 202. The surface of the second protection layer 202 which is apart from the first protection layer 201 may be attached to a display device so as allow the touch panel 10 to be combined with the display device. The formation of the first and second protection layer is identical as that of the protection layer as disclosed above. So, it will not be repeated herein.

The first protection layer 201 and the second protection layer 202 may be made of different material and perform different function. The first protection layer 201 may be made of at least one of organic materials, inorganic materials, composite materials or polymer materials. In one preferred embodiment of the present invention, the first protection layer 201 may adopt a mixed. material similar to that of the previous mentioned buffer layer 122, i.e., an organic material and an inorganic material. In another embodiment, the protection layer comprising titanium dioxide ($TiO_2$), silicon dioxide ($SiO_2$), zirconium dioxide ($ZrO_2$) and the combination thereof, or a compound formed by titanium dioxide ($TiO_2$), silicon dioxide ($S_iO_2$) and organic material(s). In addition, the second protection layer 202 may include thermosetting resin, silica, photoresist, and other suitable transparent insulating materials. With adjustment of the refractive index and thickness of the first protection layer 201, and in combination with the introduction of the buffer layer 122, it helps to improve the problem of undesired touch panel appearance. which is caused by the light reflection difference between the areas with electrode block and the areas without electrode block. For example, the first protection layer 201 comprises a refraction index $n_2$, and preferably $n_2$ is within the range set by the upper and lower layers of the first protection layer 201. In one embodiment, the first protection layer 201 is located between the sensing layer 130 and the second protection layer 202. In such a case, the refraction index $n_2$ of the first protection layer 201 would be less than the refraction index $n_T$ of the sensing layer 130 but greater than the refraction index $n_3$ of the second protection layer, i.e., $n_3<n_2<n_T$; and preferably, it would be close to the value of the square root of the product of $n_3$ and $n_T$, i.e., $n_2 \approx \sqrt{n_3 \times n_T}$. In one preferred embodiment of the present invention, the thickness of the first protection layer 201 can be 0.01 µm to 0.3 µm.

The first protection layer 201 helps to improve the problem of undesired touch panel appearance, which is caused by the light reflection difference between the areas with electrode block and the areas without electrode block. In addition, the second protection layer 202 provides a protective effect to the sensing electrode and reduces the damage to the sensing layer 130 from the air, water (vapor) or other corrosive substances in the environment. The second protection layer 202 may include thermosetting resin, silica, photoresist, and other suitable transparent insulating materials.

Figure 12A:
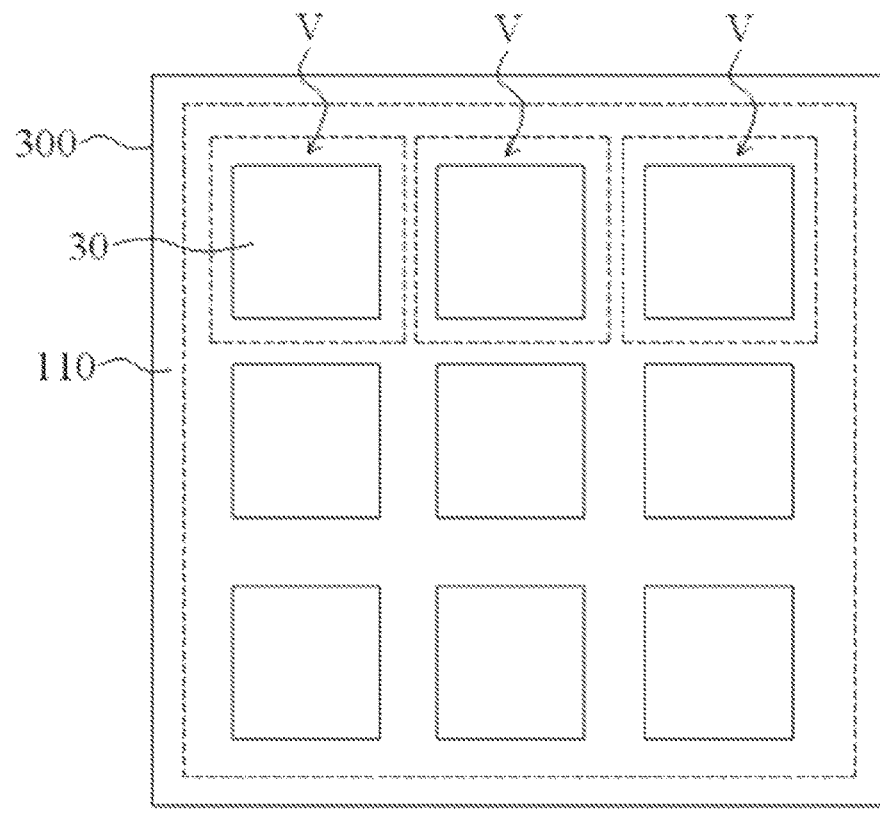
FIGS. 12A. 12B, 13 and 14 are the illustrations of the manufacturing process of yet another embodiment of the present invention.
Figure 12B:
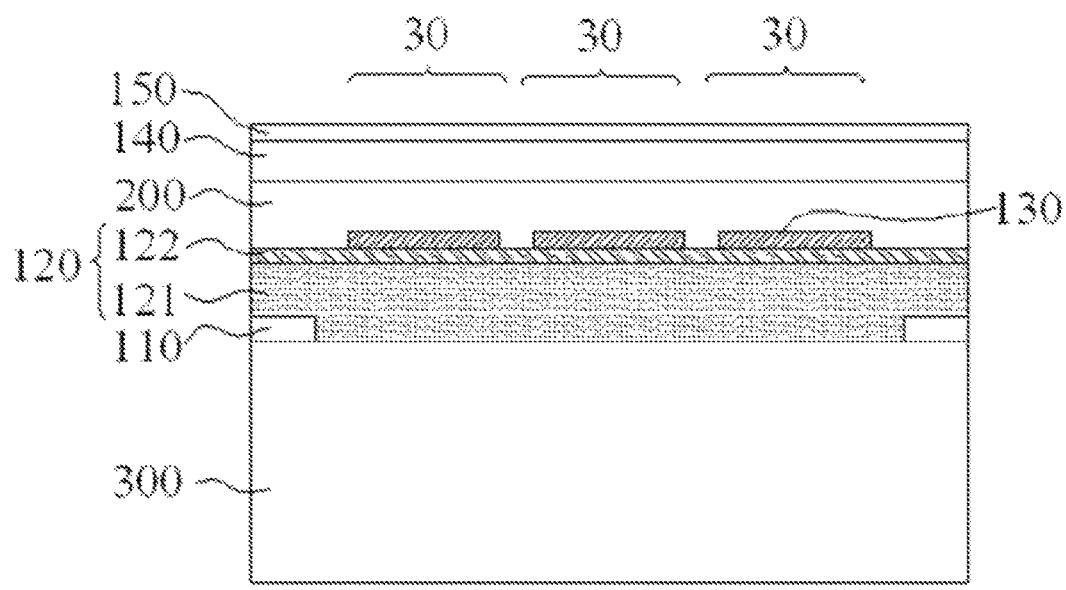
Figure 13:
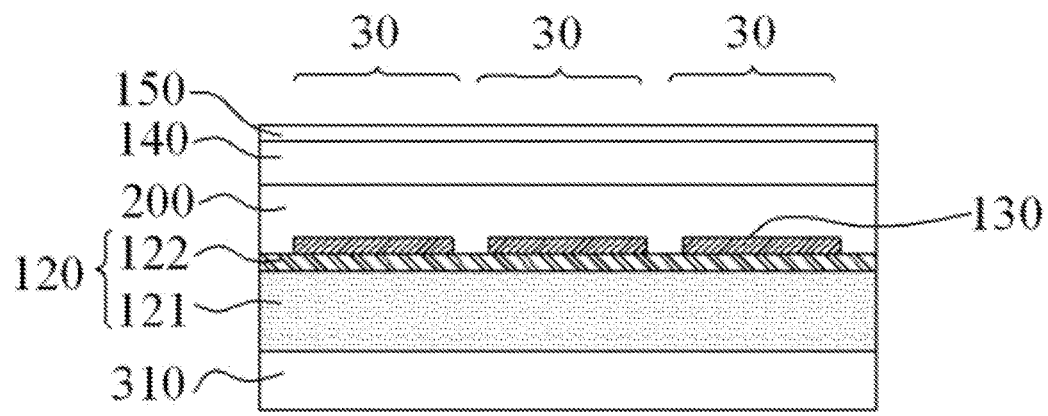

In the foregoing embodiments, the formation of one touch panel is taken for example. In order to improve the production efficiency and reduce cost, the formation of multiple touch panels will be disclosed in this paragraph, In FIGS. 12A, 12B to 14, it has shown the manufacturing process of the touch panel of another embodiment of the present invention. It may simultaneously form a plurality of film components 30 (including film layer, buffer layer, sensing layer, second adhering layer, second plate) on the first plate, prior to the step of attaching the film components 30 and the cover, the multiple film components 30 have been separated. In this way, it can improve the production efficiency and reduce costs. As shown in FIGS. 12A and 12B, which is an exploded view of FIG. 12A. a plurality of region V can be pre-arranged on a big, piece of first plate 300, the area of the region V is determined by touch panel's size. Next, on the first plate 300, it has sequentially formed film layer 121, buffer layer 122; and then, on top of the formed buffer layer in the plurality of regions V, simultaneously forming a plurality of corresponding sensing layer 130, then attaching a second plate 150 to the sensing layer by a second adhering layer 140 (alternatively, similar to the procedure shown in FIG. 9, prior to the formation of the second plate, a protection layer can be formed on top of the sensing layer).

Figure 14:
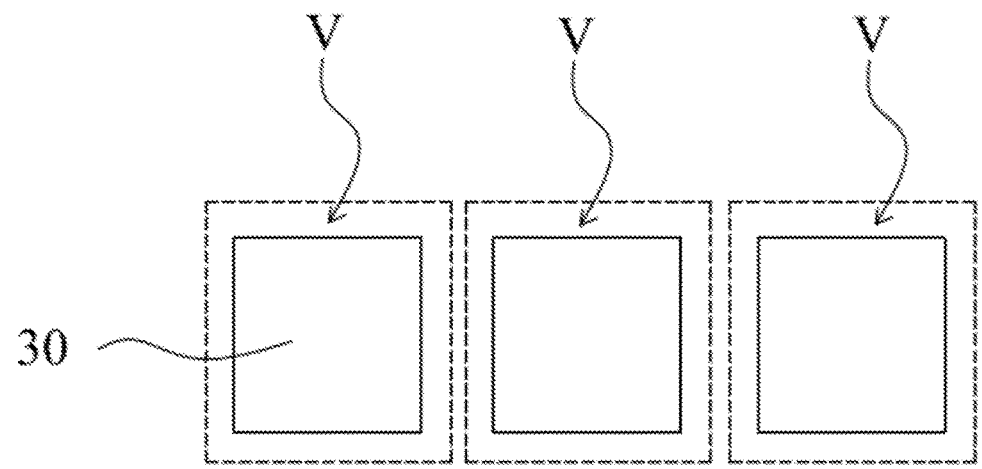

It is noted that in such a case, the plurality of sensing layers are isolated from each other, while all other components, including first plate, film layer, buffer layer, sensing layer, second adhering layer and second plate, are all in a respective one big piece form. Subsequently, the first plate 300 is removed, and then a third plate 310 is attached to the film component. Similar to the structure of the second adhering layer and second plate, the third plate 310 may be a single-sided adhesive tape including a flexible film and an adhesive layer, which the film component is attached to. The third plate 310 has a protective and supporting effect to the film component and reduces damage in the following separation step. The film components in one big piece form (including film layer, buffer layer, sensing layer, second adhering layer and second plate) is separated into multiple small pieces of film components by knife, laser, or any other cutting tool. As in FIG. 13, it has shown one example that the film components are separated into a few groups, and with each group containing three film components 30. And it is readily understood that the film component with larger or smaller size containing more or fewer film components in each group can be separated, too. Next, the third plate 310 is removed, then a plurality of covers will be attached to the small pieces of film component, and finally remove the second plate, as well as separate the multiple region V based on the corresponding sensing layers, as shown in FIG. 14. In this way, a plurality of touch panels connecting together is separated into multiple isolated individual touch panels (20 in FIG. 10).

It is also noted that during the process of adopting a large piece of first plate 300 to simultaneously form multiple touch panels as shown in FIGS. 12A, the first adhering layer for connecting the film layer to the first plate 300 can be arranged at the peripheral area of first plate 300, for example, along the four edges of first plate 300. In another embodiment, the first adhering layer can also be arranged at the peripheral area of each of the regions V, in order to further enhance the attachment of the film layer to the first plate 300. In such a way, during the process when the first plate 300 being removed, the adhering layer around the first plate 300 and around each region V will be simultaneously removed. Alternatively, the first adhering layer may be provided only around each region V, and there is no first adhering layer existing around the first plate 300. Yet, the present invention is not limited by such configurations.

The present invention has provided a touch panel and the manufacturing method thereof. Via the supporting effect from the first plate a sensing layer is formed on top of the film layer. Next, by virtue of the transferring effect of the second plate, the film layer and the sensing layer formed on it are attached to a cover. In such a way, the formed touch panel becomes lighter, thinner and of lower production costs. Moreover, as the sensing layer is located on the other side from the side where the film layer attaches the cover, it helps to avoid the issue that the connecting of sensing layer and flexible circuit board may affect the flatness of the attachment between the film layer and the cover. Furthermore, a buffer layer is formed between the film layer and the sensing layer, which helps to minimize the damage to the film layer during the formation process of the sensing layer, and further reduce the adverse effect on the film layer and sensing layer from the stress generated during the process of removing the first plate.

The foregoing is just a few preferred embodiments of the present invention. They are not to limit the present invention. The modifications, alternations and substitutions within the spirit and principle of the present invention should be in the scope claimed in the present invention.

What is claimed is:
1. A touch panel, comprising
a film layer;
a buffer layer;
a sensing layer having a refraction index $n_T$;
a cover attached to the film layer through a binding layer;
wherein the upper surface of the cover which is opposing the bottom surface attached to the film layer is a touch surface of the touch panel;
said binding layer being between said cover and said film layer;
said film layer being between said binding layer and said buffer layer;
said buffer layer being between said film layer and said sensing layer;
said buffer layer comprising an inorganic material and an organic material;
a protection layer having a refraction index $n_2$;
an adhering layer having a refraction index $n_A$;
said protection layer attaching to said sensing layer and comprising an inorganic material and an organic material; and
said protection layer is located between said sensing layer and said adhering layer;
wherein said refraction index $n_A$<said refraction index $n_2$<said refraction index $n_T$.
2. The touch panel as set forth in claim 1, comprising said film layer being formed with polyimide (PI).
3. The touch panel as set forth in claim 1, comprising said film layer being formed with a material selected from the group consisting of polypropylene (PP), polystyrene (PS), acrylonitrile-butadiene-styrene (ABS), polyethylene terephthalate (PET), polyvinyl chloride (PVC), polycarbonate (PC), polyethylene (PE), polymethyl methacrylate (PMMA), polytetrafluoro ethylene (PTFE), cyclic olefin copolymer (COP) or a combination thereof.
4. The touch panel as set forth in claim 1, comprising said film layer having a thickness of 0.1 μm to 15 μm.
5. The touch panel as set forth in claim 1, comprising said film layer having a thickness of 2 μm to 5 μm.
6. The touch panel as set forth in claim 1, comprising said inorganic material comprising titanium oxide and silicon oxide.
7. The touch panel as set forth in claim 1, comprising said inorganic material comprising zirconium oxide.
8. The touch panel as set forth in claim 1, comprising said buffer layer having a thickness of 10 angstrom (Å) to 3000 angstrom (Å).
9. The touch panel as set forth in claim 1, comprising an index of refraction of said buffer layer is between an index of refraction of said film layer and said refraction index $n_T$ of said sensing layer.
10. The touch panel as set forth in claim 1, comprising a coefficient of thermal expansion (CTE) of said buffer layer is between a coefficient of thermal expansion of said film layer and a coefficient of thermal expansion of said sensing layer.
11. The touch panel as set forth in claim 1, comprising said protection layer being formed with a material selected from the group consisting of zirconium oxide, a compound formed by titanium oxide and an organic material, a compound formed by silicon oxide and an organic material, a compound formed by zirconium oxide and an organic material and a combination thereof.
12. The touch panel as set forth in claim 1, said sensing layer comprising
a plurality of first electrode block;
said plurality of first electrode block being disposed in a first direction;
a plurality of first wire;
said plurality of first wire connecting neighboring first electrode blocks;
a plurality of second electrode block;
said plurality of second electrode block being disposed in a second direction;
a plurality of second wire;
said plurality of second wire connecting neighboring second electrode blocks;
said plurality of second electrode block being arranged on both sides of said plurality of first wire;
a plurality of insulator being arranged between said plurality of first wire and said plurality of second wire;
said plurality of first wire being insulated from said plurality of second wire;

a plurality of signal line;
said plurality of signal line electrically connecting said plurality of first electrode block and said plurality of second electrode block; and
said plurality of first electrode block being insulated from said plurality of second electrode block.

13. The touch panel as set forth in claim 12, further comprising
a shield layer;
said shield layer being disposed on at least one side of said cover; and
said shield layer shielding said plurality of signal line.

14. The touch panel as set forth in claim 1, wherein: $n_2 \approx \sqrt{n_A} \times \sqrt{n_T}$.

15. A touch panel, comprising
a film layer;
a buffer layer;
a sensing layer having a refraction index $n_T$;
a cover attached to the film layer through a binding layer;
wherein the upper surface of the cover which is opposing the bottom surface attached to the film layer is a touch surface of the touch panel;
said binding layer being between said cover and said film layer;
said film layer being between said binding layer and said buffer layer;
said buffer layer being between said film layer and said sensing layer;
a coefficient of thermal expansion (CTE) of said buffer layer being between a coefficient of thermal expansion of said film layer and a coefficient of thermal expansion of said sensing layer;
a protection layer having a refraction index $n_2$;
an adhering layer having a refraction index $n_A$;
said protection layer attaching to said sensing layer and comprising an inorganic material and an organic material; and
said protection layer is located between said sensing layer and said adhering layer;
wherein said refraction index $n_A$<said refraction index $n_2$<said refraction index $n_T$.

16. The touch panel as set forth in claim 15, comprising said film layer being formed with polyimide (PI).

17. The touch panel as set forth in claim 15, comprising said film layer being formed with a material selected from the group consisting of polypropylene (PP), polystyrene (PS), acrylonitrile-butadiene-styrene (ABS), polyethylene terephthalate (PET), polyvinyl chloride (PVC), polycarbonate (PC), polyethylene (PE), polymethyl methacrylate (PMMA), polytetrafluoro ethylene (PTFE), cyclic olefin copolymer (COP) or a combination thereof.

18. The touch panel as set forth in claim 15, comprising said film layer having a thickness of 0.1 μm to 15 μm.

19. The touch panel as set forth in claim 15, comprising said film layer having a thickness of 2 μm to 5 μm.

20. The touch panel as set forth in claim 15, comprising said buffer layer comprising an inorganic material and an organic material.

21. The touch panel as set forth in claim 20, comprising said inorganic material comprising titanium oxide and silicon oxide.

22. The touch panel as set forth in claim 15, comprising: said inorganic material comprising zirconium oxide.

23. The touch panel as set forth in claim 15, comprising said buffer having a thickness of 10 angstrom (Å) to 3000 angstrom (Å).

24. The touch panel as set forth in claim 15, comprising an index of refraction of said buffer layer is between an index of refraction of said film layer and said refraction index $n_T$ of said sensing layer.

25. The touch panel as set forth in claim 15, comprising said protection layer being formed with a material selected from the group consisting of zirconium oxide, a compound formed by titanium oxide and an organic material, a compound formed by zirconium oxide and an organic material, and a combination thereof.

26. The touch panel as set forth in claim 15, said sensing layer comprising
a plurality of first electrode block;
said plurality of first electrode block being disposed in a first direction;
a plurality of first wire;
said plurality of first wire connecting neighboring first electrode blocks;
a plurality of second electrode block;
said plurality of second electrode block being disposed in a second direction;
a plurality of second wire;
said plurality of second wire connecting neighboring second electrode blocks;
said plurality of second electrode block being arranged on both sides of said plurality of first wire;
a plurality of insulator being arranged between said plurality of first wire and said plurality of second wire;
said plurality of first wire being insulated from said plurality of second wire;
a plurality of signal line;
said plurality of signal line electrically connecting said plurality of first electrode block and said plurality of second electrode block; and
said plurality of first electrode block being insulated from said plurality of second electrode block.

27. The touch panel as set forth in claim 26, further comprising
a shield layer;
said shield layer being disposed on at least one side of said cover; and
said shield layer shielding said plurality of signal line.

28. The touch panel as set forth in claim 15, wherein: $n_2 \approx \sqrt{n_A} \times \sqrt{n_T}$.

* * * * *